United States Patent [19]

Berning

[11] Patent Number: 5,612,646
[45] Date of Patent: Mar. 18, 1997

[54] OUTPUT TRANSFORMERLESS AMPLIFIER IMPEDANCE MATCHING APPARATUS

[76] Inventor: David W. Berning, 12430 McCrossin La., Potomac, Md. 20854

[21] Appl. No.: 521,494

[22] Filed: Aug. 30, 1995

[51] Int. Cl.$^6$ ................................................ H03F 3/38
[52] U.S. Cl. ....................................... 330/10; 330/297
[58] Field of Search .............................. 330/10, 118, 123, 330/146, 297

[56] References Cited

U.S. PATENT DOCUMENTS

| | | | |
|---|---|---|---|
| 3,217,263 | 11/1965 | Hinrichs | 330/10 |
| 3,931,581 | 1/1976 | Kush et al. | 330/146 X |
| 4,409,559 | 10/1983 | Amada et al. | 330/297 X |
| 5,442,317 | 8/1995 | Stengel | 330/10 |

*Primary Examiner*—Steven Mottola
*Attorney, Agent, or Firm*—Fulbright & Jaworski L.L.P.

[57] ABSTRACT

A linear audio amplifier includes a push-pull pair of vacuum tubes operating in a linear amplification mode coupled through a pair of dc-dc switching power converters to an external load impedance. Each power converter includes a transformer with one or more secondary windings that drive rectifier circuits, and the resultant dc voltage sources are loaded by their respective tubes. The power input ports of two bridge power converters are connected in a series totem-pole fashion with the minus power input port of the top bridge connected to the plus power input port of the bottom bridge. A center-tapped fixed voltage source is connected across the two-bridge pair such that the positive voltage is connected to the plus power input port of the top bridge, and the negative voltage is connected to the minus power input port of the bottom bridge. One side of an external load impedance is connected through a noise filter to the junction point of the two bridges, and the other side of the external load is connected to the center tap of the fixed voltage source. The output power ports of each converter drive the primaries of their respective converter transformers. The effective turns ratio between primary and secondary windings of these converter transformers determine the voltage/current step-up/step-down relationships between the tubes and the external load impedance.

27 Claims, 2 Drawing Sheets

OUTPUT TRANSFORMERLESS AMPLIFIER IMPEDANCE MATCHING APPARATUS

BACKGROUND OF THE INVENTION

1. Field of the Invention

This invention relates to audio power amplifiers for driving loudspeakers, and in particular, vacuum tube-type amplifiers. Thirty years after transistor amplifiers became dominant in the marketplace due to their many advantages over vacuum tube amplifiers, there is still substantial interest in vacuum tube amplifiers. Many people feel vacuum tube amplifiers offer superior subjective performance over their solid-state counterparts when used to reproduce music over loudspeakers.

2. Discussion of the Related Technology

One of the biggest problems that has always plagued tube-type amplifiers is that of matching the high-voltage, low current operation of tubes to the low-voltage, high-current requirements of dynamic loudspeakers. The standard solution for this problem is to couple the tubes to the speaker with an output transformer. Winding a transformer that is capable of operating over a wide frequency range is difficult, and the frequency extremes have never been reproduced with low distortion. Furthermore, various parasitic effects cause unpredictable and complex phase shift characteristics that cause stability problems when negative feedback is used. In order to reproduce low frequencies, an output transformer must be large and heavy. Weights of five to ten kilograms are common in high-fidelity applications, and good transformers are expensive.

There are many other problems with output transformers. They become short circuits at frequency extremes. They saturate at low frequencies, and become capacitors at high frequencies. Both effects cause overheating of output tubes. Since output transformers cannot pass direct current (dc), global dc stabilization of multi-stage amplifiers is not possible.

There have been many attempts over the years to eliminate the output transformer. The most successful is what is commonly called OTL, an abbreviation for "output-transformerless," and it is based on placing a sufficient number of tubes in parallel to be able to drive the required current into the loudspeaker. These amplifiers often have ten to twenty or more large-heater type tubes per monaural unit. Even though these amplifiers may have sufficient current to drive the loudspeaker, they are not sufficiently low in output impedance under large signal conditions to properly control back emf from many loudspeakers, and careful matching of amplifier to speaker is required.

A compromise method of solving the problem is to use vacuum tubes in the low-level stages of a power amplifier, and use a transistorized output stage. This type of amplifier has enjoyed some success, but mainly for its relatively low cost. Amplifiers of this type have not won widespread approval from those who prefer tube amplifiers over all solid-state ones.

SUMMARY OF THE INVENTION

It is, therefore, an object of the present invention to provide an amplifier that eliminates the traditional output transformer. It is also an object of the present invention to provide an amplifier that is optimally matched in impedance to the load. It is a further object of the present invention to provide an amplifier that enjoys the sought-after transfer characteristics that tubes possess, which seem to influence the subjective qualities of the amplifier.

It is a still further object of the present invention to provide an amplifier that offers improved amplitude and phase accuracy at frequency extremes. It is a still further object of the present invention to provide an amplifier that allows improved stability when negative feedback is used. It is a still further object of the present invention to provide an amplifier that can reproduce frequencies down to dc. It is a still further object of the present invention to provide an amplifier that incorporates dc level shifting capability, in particular, an isolation amplifier stage which permits dc signal components to be carried through several stages of tube-only amplification. This isolation also provides the capability of completely separating the output ground return from the input ground return if so desired.

It is a still further object of the present invention to provide an amplifier that is so versatile that it can be built around many different types of tubes with a wide range of characteristics, including triodes, tetrodes, and pentodes, and even transistors. It is a still further object of the present invention to provide an amplifier that can be operated in class A, B, AB, or C. It is a still further object of the present invention to provide an amplifier that can impedance match with much larger ratios than are practical with output transformers. It is a still further object of the present invention to provide an amplifier that does not overheat when driven with either very high or very low frequencies. It is a still further object of the present invention to provide an amplifier that incorporates no analog signal processing by solid-state devices, as such processing generally influences the subjective qualities of the amplifier.

Toward the fulfillment of these and other objects, the output transformerless amplifier impedance matching apparatus and method has at least one switching power converter bridge having opposite terminals connected between a fixed source of voltage and the load. Two bridges and two power supplies are used for bi-polar or push-pull applications. The returns for the power supplies are connected to the return for the load. The other two terminals of a given bridge are connected across the primary winding of a conversion transformer. The four switching transistors that make up the legs of the bridge are alternately switched on and off at a high rate of speed so that the voltage difference between the fixed voltage and the load voltage is impressed across the primary of the conversion transformer. This voltage difference is a relatively slowly changing voltage, and it is alternately impressed across the converter transformer in one polarity and then the other polarity at a rate determined by the gate drive for the transistors. One gate drive transformer can be used for driving all eight gates of a bi-polar two-bridge system. A gate drive frequency of 250 kHz is practical for desired amplifier bandwidths of 100 kHz assuming simple filtering is used to remove switching noise from the load. The full-wave nature of the circuit and the fact that it uses square wave switching leads to the bulk of the switching noise being high-order harmonics of 500 kHz, which can be effectively filtered with a 2nd order L-C filter.

The secondary of the converter transformer with associated rectifiers applies a voltage to the anode electrode of a power vacuum tube that is proportional to the voltage on the primary of the converter transformer. The ratio between these voltages can be made quite large, if desired, by using numerous secondaries with rectifiers placed in series. In principle, one secondary with many turns, with a primary of only a few turns would provide a large conversion ratio, but in practice limits are imposed by parasitic effects in such a transformer and the requirement for very fast high-voltage switching diodes which do not presently exist. A typical application might use three turns on the primary of the converter transformer and five turns on each of 20 secondaries to give a conversion ratio of 33.3. High quality audio output transformers become very difficult to make with conversion ratios of more than 15 for each half of the primary winding because of interwinding capacitance. Higher conversion ratios lower the output impedance of the amplifier and raise the efficiency.

Power is transferred to the load in the following way. As the grid of the tube is driven positive, anode current increases per the transfer characteristics of the tube. This action causes the anode to cathode voltage to decrease, which in turn loads the converter and forces the voltage across the converter to decrease in the same proportion as the voltage across the tube. The current to the load is also increased by the same conversion ratio. The voltage across the load increases as the voltage across the converter decreases. It should be noted that there is ideally no power gain or loss incurred by the action of the converter. In practice, the converter is not quite 100% efficient, and slightly less anode dissipation occurs than would be expected for a given load current. The balance of the dissipation occurs in the converter components.

Push-pull operation is achieved by having two bridges, one in series with the load and a positive voltage, and the other in series with the load and a negative voltage. The bridge conversion circuitry for the negative leg is a duplication of that for the positive leg except that the tube controlling this leg must be provided with a grid signal that is inverted in polarity.

Some additional features of this amplifier circuit should be noted. The converter transformers provide isolation between input and output ground returns, yet the dc component of the desired signal is coupled from the output or converter load tube to the load. Both of these features make it practical to construct a multi-stage, all tube, dc-coupled amplifier. Dc coupled circuits are easy to make with transistors because both NPN and PNP devices are available, making the required level shifting easy. Only one polarity of tubes is available, so each stage of amplification results in a progressively higher dc voltage level on the output of each stage. Tube amplifiers are therefore usually built with coupling capacitors between stages. The fact that an audio amplifier is ac-coupled does not seem to be a significant detractor at first glance, but the ac-coupling causes problems when the amplifier is driven into overload. When overload occurs, the grids of various tubes, usually the output tubes first, are driven above their cathode voltages. This causes grid conduction and the charge states of coupling capacitors are upset. Usually the average dc bias levels of both output tubes are driven negative, causing severe crossover distortion until the bias can return to normal. This upset may persist for a second, depending on the time constant of the bias circuit which is normally chosen to be long to give better low-frequency response. The problem is made much worse in amplifiers that use larger amounts of negative feedback. Given an output stage which can both provide isolation for canceling the unwanted (common mode) dc built up as a result of previous amplification, and passing the desired (differential) dc, complete dc coupling can be realized. Such dc coupling allows the automatic stabilization of all operating points in the amplifier, and allows optimum behavior during overload. Automatic stabilization circuits can readily be interfaced with shutdown protection circuits if desired.

Protection is not as important an issue with the present invention as it is with transistor amplifiers because under shorted load conditions the output or converter load tubes take the high dissipation, and not the switching transistors in the converter bridges. Like in conventional tube amplifiers the tubes can take large overloads for brief periods of time, whereas transistors under similar conditions will be destroyed. There is one abusive condition of note that often leads to failure in tube amplifiers with output transformers. If such an amplifier is operated without the load, the anode voltage on the output tubes can reach thousands of volts due to the inductive nature of an unloaded transformer. These high voltages often cause failure of insulating materials, often leading to arcing and perhaps fire. In the present invention, operation without a load does not generate such a stress condition.

DETAILED DESCRIPTION OF THE PREFERRED EMBODIMENTS

Figure 1:
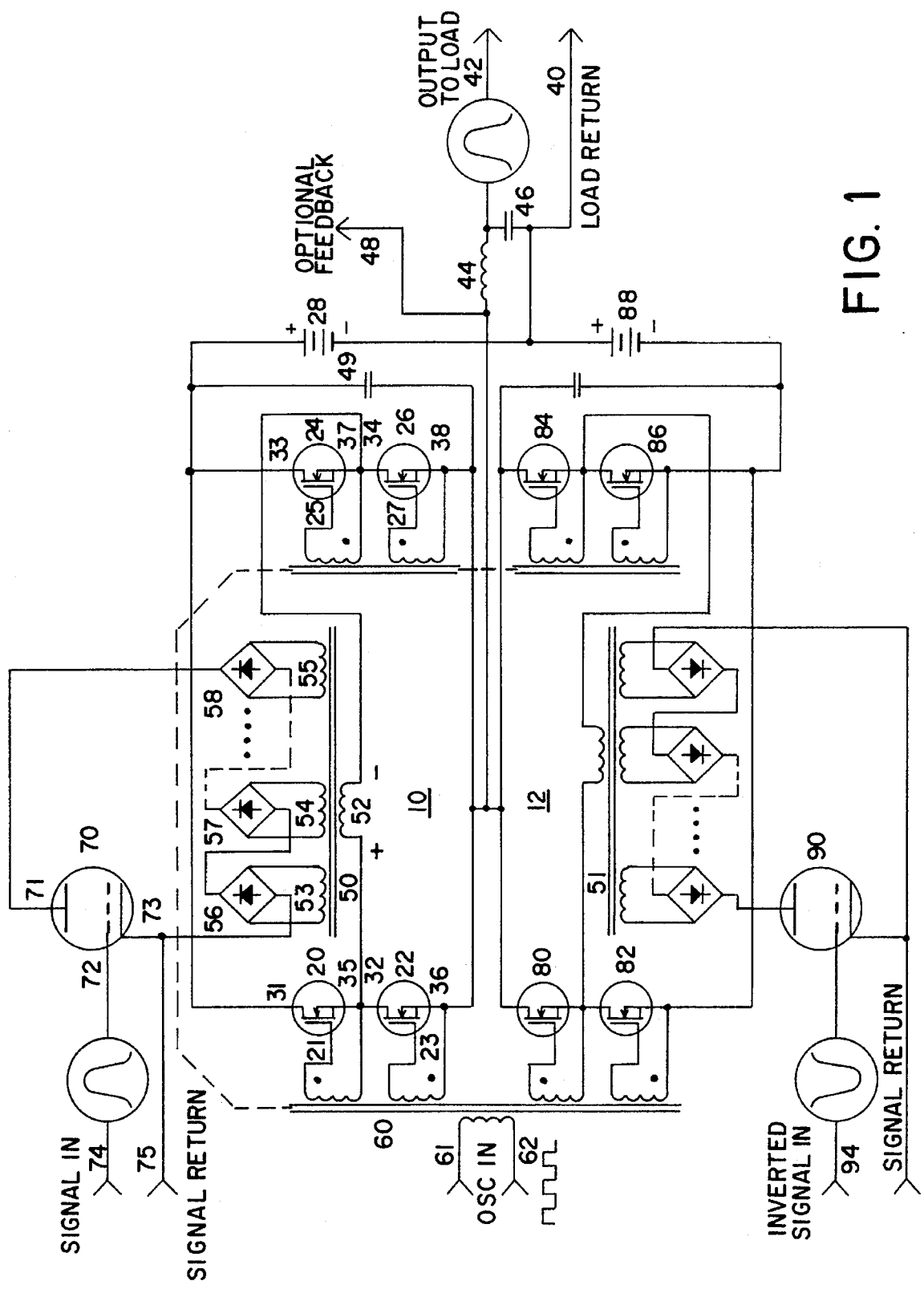
FIG. 1 is a schematic representation illustrating the output portion of an amplifier according to an embodiment of this invention configured for bi-polar or push-pull operation.

With reference to FIG. 1, which is a schematic representation of the output portion of an amplifier configured for bi-polar or push-pull operation, an upper bridge 10 is formed by connecting four N-channel MOSFET switching transistors 20, 22, 24, and 26 together. The drain terminal 31 of transistor 20 is connected to the drain terminal 33 of transistor 24, and both drain terminals 31, 33 are connected to the positive terminal of power supply 28. This junction point is the positive power input port for the power converter bridge. The negative terminal of said power supply 28 is connected to the return terminal for the load 40. The source terminal 36 of transistor 22 is connected to the source terminal 38 of transistor 26, and both source terminals 36, 38 are connected to the output to load terminal 42 through an optional filter inductor 44. The junction point of source terminal 36 and source terminal 38 is the negative power input port for the power converter bridge.

Optional filter capacitor 46 may be placed across the load output terminals 42 and 40. An optional feedback connection 48 may also be made directly to the junction of the source terminals 36 and 38 rather than to the load side of the filter inductor 44. Bringing the feedback out before the output filter greatly enhances the stability of the amplifier because the phase shift to the output caused by the filter does not enter into the feedback, and the output stage bandwidth is much higher before the filter. Furthermore, the filter acts to isolate the feedback from any reactive characteristics that the load may have.

Returning to the upper bridge 10, the source terminal 35 of transistor 20 is connected to the drain terminal 32 of transistor 22. These two terminals drive one end of the primary winding 52 of the converter transformer 50. Similarly, the source terminal 37 of transistor 24 is connected to the drain terminal 34 of transistor 26. These two terminals drive the other end of the primary winding 52. In other words, the converter transformer 50 is connected across the two power output ports of the power converter bridge.

The gate terminals of all four transistors are driven between their respective gate and source terminals by the gate drive transformer 60 which is excited with a square wave applied to its primary winding through terminals 61 and 62. The gate transformer secondary windings are configured to drive the gates of the transistors as follows. As gate terminal 21 of transistor 20 is driven positive to turn on said transistor, gate terminal 27 of transistor 26 is also driven positive. At the same time gate terminal 23 of transistor 22 is driven negative to turn off said transistor and gate terminal 25 of transistor 24 is driven negative to turn off that transistor. During this portion of the switching cycle, the primary 52 of the converter transformer 50 is effectively connected between the power supply 28 and the output 42 through the optional filter inductor 44 in a + to − direction, as both transistors 20 and 26 are short circuits and transistors 22 and 24 are open circuits. During the following half-cycle, all of the transistors switch states and the primary of the converter transformer 50 is connected between the power supply 28 and the output in a − to + direction. As this switching action is cycled repetitively, it causes a square wave with a peak voltage amplitude equal to the difference between the power supply 28 voltage and the load terminal 42 voltage to be applied to the primary winding 52 of the converter transformer 50. A capacitor 49 can be connected between the drain terminals junction of transistors 20 and 24 and the source terminals junction of transistors 22 and 26 to improve the switching efficiency and to reduce noise. The value of this capacitor is chosen to be sufficiently small so as not to cause much reduction in the bandwidth beyond the reduction in bandwidth caused by the output filter, but sufficiently large so as to dominate over the parasitic capacitances present in the transistors.

The converter transformer 50 is shown with three secondary windings 53, 54, and 55. These windings drive full wave rectifier bridges 56, 57, and 58 respectively. The output terminals of the rectifier bridges are connected in series so that their individually generated output voltages add. The connection between bridge 57 and 58 is dashed to indicate additional stages may be present but are not shown. Higher conversion ratios are obtained when more stages are used, and twenty such stages may be used in a typical application. Other rectifier configurations, such as full-wave center tapped rectifier can be used in place of the bridges, but capacitor-based multiplier types can not be used without a major sacrifice in bandwidth.

The output of the final bridge, 58 in the present figure, is connected to the anode terminal 71 of vacuum tube 70. While this tube is shown as a triode in the present figure, it could be a pentode or tetrode or other multi-grid tube, or even a transistor operating as a linear amplifier without departing from the scope of this invention. In such cases the additional tube elements could be connected in any number of either conventional or unconventional ways. Returning to the figure, an analog voltage 74 is applied to the controlling grid terminal 72 of the tube 70. The cathode terminal 73 is coupled to both the negative output terminal of the bridge 56 and the analog signal return 75. It is understood that a resistance can be inserted in the cathode circuit for bias or operating point stabilization purposes without departing from the spirit of this invention. Such a resistance (which is not shown in the figure) may be common to both tubes of a push-pull system.

The description relating to FIG. 1 up to this point has centered on the portion of the circuit that supplies only positive voltage to the load. The components associated with the bottom transistor bridge 12 are responsible for supplying negative voltages to the load. The operation of the bottom bridge is identical to the operation of the top bridge, and only the details in connections that are different will be discussed.

Referring to FIG. 1, the drain terminals of transistors 80 and 84 are connected to the output terminal 42 through optional filter inductor 44. The source terminals of transistors 82 and 86 are connected to the negative terminal of power supply 88. Power supply 88 has its positive terminal connected to the load return terminal 40. In a preferred embodiment, the same gate drive transformer 60 that drives the transistors in the upper bridge also drives the transistors 80, 82, 84, and 86 in the bottom bridge, although two separate gate drive transformers could be used in an alternate embodiment of this invention. The bottom bridge 12 has its own converter transformer 51, which operates in the same manner as converter transformer 50 in the top bridge 10. As a result of the switching operation, the peak square wave voltage that appears across the primary of converter transformer 51 is the voltage difference between the negative supply voltage 88 and the voltage at the output terminal 42. It should be noted that the peak value of this square wave voltage can ideally be as high as the sum voltage of the two power supplies 28 and 88 when the output of the amplifier swings fully positive. Under these circumstances tube 70 would be fully turned on and there would be minimum square wave voltage across the primary winding of transformer 50.

One additional difference affecting the operation of the bottom bridge 12 is that the analog signal 94 coupled to tube 90 must be an inverted replica of signal 74 that drives tube 70.

Figure 2:
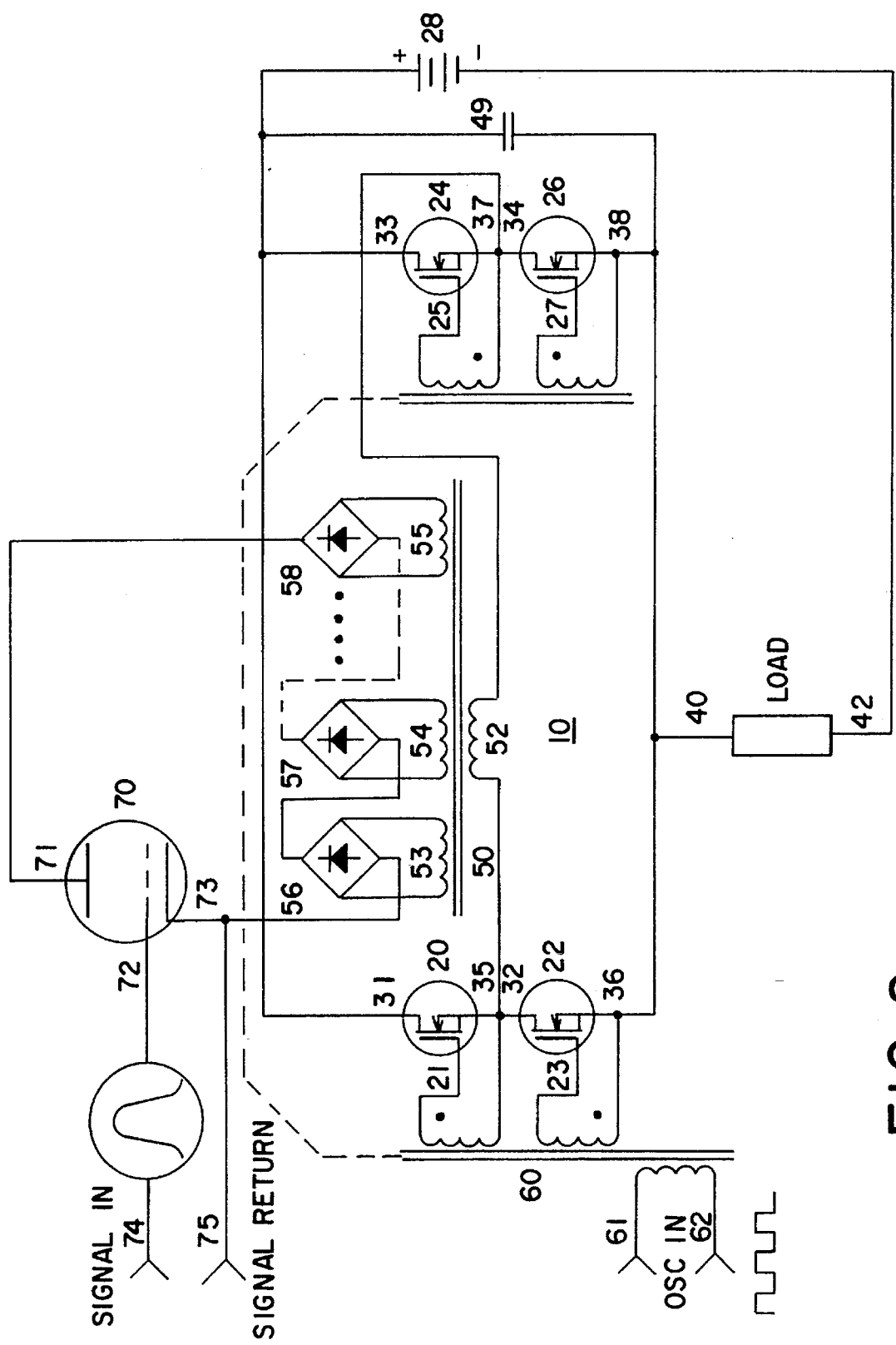
FIG. 2 is a schematic representation illustrating the output portion of an amplifier according to an embodiment of this invention configured for single-ended operation.

FIG. 2 is presented to show the present invention in its simplest form, which is an embodiment suitable for single-ended or uni-polar applications. Output current can only pass in one direction through the load. The details of operation for this circuit are similar to those already presented and will not be repeated here. Like reference numerals from FIG. 1 represent like components.

Of course, variations of the specific construction and arrangement of the amplifier disclosed above can be made by those skilled in the art without departing from the invention as defined in the appended claims.

What is claimed is:

1. A linear audio amplifier comprising:

a dc voltage source having terminals for connecting in series an external load impedance;

a solid-state switching dc-dc power converter stage connected to a series combination of the dc voltage source and the external load impedance;

a linear amplifier stage configured as a load for the power converter stage; and wherein the series combination of the dc voltage source and the external load impedance provides input power to the power converter stage.

2. An amplifier according to claim 1 wherein the power converter stage comprises:

a voltage/current impedance transforming converter transformer.

3. An amplifier according to claim 1 wherein the dc voltage source is a tapped dc voltage source.

4. An amplifier according to claim 3 wherein the power converter stage comprises:

a first dc-dc power converter having a positive power input port connected to a most positive terminal of the tapped dc voltage source; and a second dc-dc power converter, having a negative power input port connected to a most negative terminal of the tapped dc voltage source, wherein a negative power input port of the first power converter is connected to a positive power input port of the second power converter.

5. An amplifier according to claim 4 wherein the linear amplifier stage comprises:

an in-phase linear amplifying device; and an inverted phase linear amplifying device, wherein each linear amplifying device is configured as a separate load for the first and second power converters.

6. An amplifier according to claim 4 further comprising:

terminals for coupling an external load impedance between a junction point of the first and second power converters and a tapped point of the tapped dc voltage source.

7. An amplifier according to claim 4 wherein the first power converter further comprises:

a voltage/current impedance transforming converter transformer.

8. An amplifier according to claim 4 wherein the second power converter further comprises:

a voltage/current impedance transforming converter transformer.

9. A linear audio amplifier comprising:

a voltage source having terminals for connecting in series an external load impedance;

a power converter stage, connected to a series combination of the voltage source and the external load impedance, having at least a converter transformer; and a linear amplifying stage connected as a load to the power converter stage.

10. An amplifier according to claim 9 wherein the power converter stage further comprises:

a full-wave transistor bridge;

a gate-transformer connected to the transistor bridge, wherein a primary winding of the gate-transformer is connected to an ac source; and circuit means for connecting the series combination of the voltage source and the external load impedance between two power input ports of the transistor bridge.

11. An amplifier according to claim 10 wherein the converter transformer comprises:

a primary winding connected across the two power output ports of the transistor bridge;

at least one secondary winding; and circuit means for full-wave rectification of a secondary voltage of the converter transformer.

12. An amplifier according to claim 9 wherein the linear amplifying stage comprises:

a linear amplifying device comprising at least:
an input main current port;
an output main current port; and
at least one current controlling port;

circuit means for connecting a rectified secondary voltage output from the converter transformer across the input main current port and the output main current port; and an analog signal source coupled to the at least one current controlling port.

13. An amplifier according to claim 9 wherein the power converter stage comprises:

a full four-transistor bridge operating in a switching mode.

14. An amplifier according to claim 13 wherein two transistors of the full four-transistor bridge are switched on and two transistors of the full four-transistor bridge are switched off at any given time.

15. An amplifier according to claim 14 wherein the transistors switch off and on at a frequency higher than an intended bandwidth of the amplifier.

16. An amplifier according to claim 9 wherein the linear amplifying stage comprises:

an in-phase linear amplifying device; and an inverted phase linear amplifying device.

17. An amplifier according to claim 16 wherein the power converter stage further comprises:

a first power converter bridge having a first converter transformer with a first circuit means for rectifying a secondary voltage of the first converter transformer;

a second power converter bridge having a second converter transformer with a second circuit means for rectifying a secondary voltage of the second converter transformer;

a first circuit means for connecting the rectified secondary voltage of the first converter transformer across the in-phase linear amplifying device; and a second circuit means for connecting the rectified secondary voltage of the second converter transformer across the inverted phase linear amplifying device.

18. An amplifier according to claim 16 wherein the linear amplifying stage comprises:

a normally phased analog signal coupled to the in-phase linear amplifying device; and an inverted phase analog signal coupled to the inverted phase amplifying device.

19. An amplifier according to claim 17 wherein the first and second power converter bridges are configured so that a positive power input port of the first power converter bridge is connected to a most positive terminal of a tapped, fixed dc voltage source, a negative power input port of the second power converter is connected to a most negative terminal of the tapped dc voltage source, and a negative power input port of the first power converter is connected to a positive power input port of the second power converter.

20. An amplifier according to claim 19 further comprising:

terminals for coupling an external load impedance between a junction point of the first and second power converter bridges and a tapped point of the tapped dc voltage source.

21. An amplifier according to claim 16 wherein the linear amplifying stage operates in one of class A, class AB, class B, or class C.

22. An amplifier according to claim 12 wherein the linear amplifying device is a vacuum tube.

23. An amplifier according to claim 16 wherein the in-phase linear amplifying device is a vacuum tube and the inverted phase linear amplifying device is a vacuum tube.

24. A method for amplifying comprising the steps of:

attaching an external load impedance in series with a dc voltage source;

connecting power input terminals of a solid-state switching dc-dc power converter stage across the series combination of the external load impedance and the dc voltage source; and configuring a linear amplifier stage as a load for the power converter stage.

25. A method for amplifying according to claim 24 further comprising the steps off connecting a rectified secondary voltage output from the power converter stage across an input main current port and an output main current port of the linear amplifier stage after the step of configuring; and coupling an analog signal source to at least one current controlling port of the linear amplifying stage after the step of connecting.

26. An amplifier according to claim 1 wherein the dc voltage source is a dual plus-minus source with a common tapped point and an input to the power converter stage is connected to a series combination of the external load impedance and said tapped dc voltage source.

27. An amplifier according to claim 9 wherein the dc voltage source is a dual plus-minus source with a common tapped point and an input to the power converter stage is connected to a series combination of the external load impedance and said tapped dc voltage source.

* * * * *